(12) United States Patent  
Ozu et al.

(10) Patent No.: US 9,034,698 B2  
(45) Date of Patent: May 19, 2015

(54) SEMICONDUCTOR DEVICE MANUFACTURING METHOD

(71) Applicant: Tokyo Electron Limited, Tokyo (JP)

(72) Inventors: Toshihisa Ozu, Hwaseong-si (KR); Shota Yoshimura, Miyagi (JP); Hiroto Ohtake, Miyagi (JP); Kosuke Kariu, Miyagi (JP); Takashi Tsukamoto, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/464,978

(22) Filed: Aug. 21, 2014

(65) Prior Publication Data

US 2015/0056773 A1   Feb. 26, 2015

(30) Foreign Application Priority Data

Aug. 23, 2013  (JP) ................................ 2013-173027

(51) Int. Cl.  
*H01L 21/332* (2006.01)  
*H01L 29/49* (2006.01)  
*H01L 29/66* (2006.01)  
(52) U.S. Cl.  
CPC ...... *H01L 29/4941* (2013.01); *H01L 29/66795* (2013.01)

(58) Field of Classification Search  
None  
See application file for complete search history.

(56) References Cited

U.S. PATENT DOCUMENTS

| | | | |
|---|---|---|---|
| 2004/0038537 A1* | 2/2004 | Liu et al. | 438/694 |
| 2004/0082184 A1 | 4/2004 | Suzuki | |
| 2004/0113171 A1* | 6/2004 | Chiu et al. | 257/119 |
| 2008/0160766 A1* | 7/2008 | Kim et al. | 438/701 |
| 2009/0098705 A1 | 4/2009 | Satonaka | |
| 2011/0039407 A1 | 2/2011 | Nishizuka | |

FOREIGN PATENT DOCUMENTS

WO   2009/028480 A1   3/2009

* cited by examiner

*Primary Examiner* — Mark A Laurenzi  
*Assistant Examiner* — Bo Bin Jang  
(74) *Attorney, Agent, or Firm* — Pearne & Gordon LLP

(57) ABSTRACT

A semiconductor device manufacturing method includes exciting a processing gas containing a HBr gas and a $Cl_2$ gas within a processing chamber that accommodates a target object including a substrate, regions made of silicon, which are protruded from the substrate and arranged to form a gap, a metal layer formed to cover the regions, a polycrystalline silicon layer formed on the metal layer, and an organic mask formed on the polycrystalline silicon layer. The $Cl_2$ gas is supplied at a flow rate of about 5% or more to about 10% or less with respect to a flow rate of the HBr gas in the processing gas.

7 Claims, 14 Drawing Sheets

SEMICONDUCTOR DEVICE MANUFACTURING METHOD

CROSS-REFERENCE TO RELATED APPLICATION

This application claims the benefit of Japanese Patent Application No. 2013-173027 filed on Aug. 23, 2013, the disclosures of which are incorporated herein by reference.

TECHNICAL FIELD

The embodiments described herein pertain generally to a semiconductor device manufacturing method.

BACKGROUND

In a manufacturing process of an electronic device such as a MOS transistor, plasma etching of a polycrystalline silicon layer is performed. Plasma etching of a polycrystalline silicon layer is described in, for example, Patent Document 1. To be specific, Patent Document 1 describes that a polycrystalline silicon layer is etched by exciting a mixed gas containing a HBr gas, a $Cl_2$ gas, and an Ar gas.

Further, a fin-type field effect transistor has been known as a kind of electronic device. The fin-type field effect transistor includes multiple fin regions made of silicon. The multiple fin regions are arranged on a substrate, and a gate electrode is provided to cover the fin regions. Regarding the gate electrode, metal materials having different work functions may be used as a N-type transistor and a P-type transistor. In a manufacturing process of a device, such as the fin-type field effect transistor, in which metal material is buried, a metal layer, such as a TiN layer, is formed on the fin regions, and polycrystalline silicon formed on the metal layer is etched. Then, the metal material is buried in a region from which the polycrystalline silicon is removed.

Patent Document 1: International Publication No. WO2009/028480

In the above-described manufacturing process of the fin-type field effect transistor, a polycrystalline silicon layer present at a fine gap, e.g., between adjacent fin regions, needs to be removed by etching, and damage to the metal layer caused by the etching needs to be suppressed.

SUMMARY

Therefore, in the present technical field, there has been demanded an etching process capable of suppressing a polycrystalline silicon layer from being left in a region from which the polycrystalline silicon layer needs to be removed, and also capable of suppressing damage to an underlying metal layer.

In accordance with one aspect, a semiconductor device manufacturing method includes exciting a processing gas containing a HBr gas and a $Cl_2$ gas within a processing chamber that accommodates a target object including a substrate, regions made of silicon, which are protruded from the substrate and arranged to form a gap, a metal layer formed to cover the regions, a polycrystalline silicon layer formed on the metal layer, and an organic mask formed on the polycrystalline silicon layer. The $Cl_2$ gas is supplied at a flow rate of about 5% or more to about 10% or less with respect to a flow rate of the HBr gas in the processing gas.

In accordance with this method, since the processing gas contains the $Cl_2$ gas having the flow rate of about 5% or more with respect to the flow rate of the HBr gas, it is possible to suppress the polycrystalline silicon layer from being left. By way of example, it is possible to suppress a reaction product generated from a reaction between the polycrystalline silicon layer and an active species in plasma from being left, and also possible to suppress the polycrystalline silicon layer from remaining in the gap. Further, since the $Cl_2$ gas contained in the processing gas has the flow rate of about 10% or less with respect to the flow rate of the HBr gas, it is possible to suppress damage to the metal layer.

In the example embodiment, in the exciting of the processing gas, a pressure within the processing chamber may be set to be about 6.666 Pa or more and the processing gas may be excited with a microwave. In this example embodiment, since the pressure within the processing chamber is set to be high and ion energy is lowered, it is possible to further suppress damage to the metal layer. Further, under such a high pressure, plasma can be generated with a microwave.

In the example embodiment, the processing gas may further contain a He gas. The He gas among rare gases has a small atomic weight. Since the He gas is used as a rare gas to be contained in the processing gas, it is possible to suppress damage to the metal layer.

In the example embodiment, the metal layer may be a TiN layer. Further, in the target object, the regions made of silicon may form fin regions of a fin-type field effect transistor.

In the example embodiment, the semiconductor device manufacturing method may further include forming the organic mask. Further, the forming of the organic mask may include forming an organic layer on the polycrystalline silicon layer; forming a mask on the organic layer; etching the organic layer by generating plasma of a first gas containing an oxygen gas within the processing chamber; and etching the organic layer by generating plasma of a second gas containing a nitrogen gas and a hydrogen gas within the processing chamber. In accordance with this method, before the polycrystalline silicon layer is exposed to the plasma of the first gas, the gas used in etching the organic layer may be changed to the second gas. Therefore, it is possible to suppress oxidation of the polycrystalline silicon layer.

In the example embodiment, in the etching of the organic layer by generating plasma of the first gas, the first gas may further contain a HBr gas, a pressure within the processing chamber is set to be about 10.67 Pa or more, and the first gas is excited with a microwave. Since the first processing gas containing the HBr gas is excited at a relatively high pressure, it is possible to suppress re-dissociation of a reaction product generated during the etching process. As a result, even if a pattern formed by the etching process includes a dense pattern and a sparse pattern, the both patterns can be formed in substantially the same depth. Further, under such a high pressure, plasma can be generated with a microwave.

As explained above, it is possible to suppress a polycrystalline silicon layer from being left in a region from which the polycrystalline silicon layer needs to be removed, and also possible to suppress damage to an underlying metal layer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
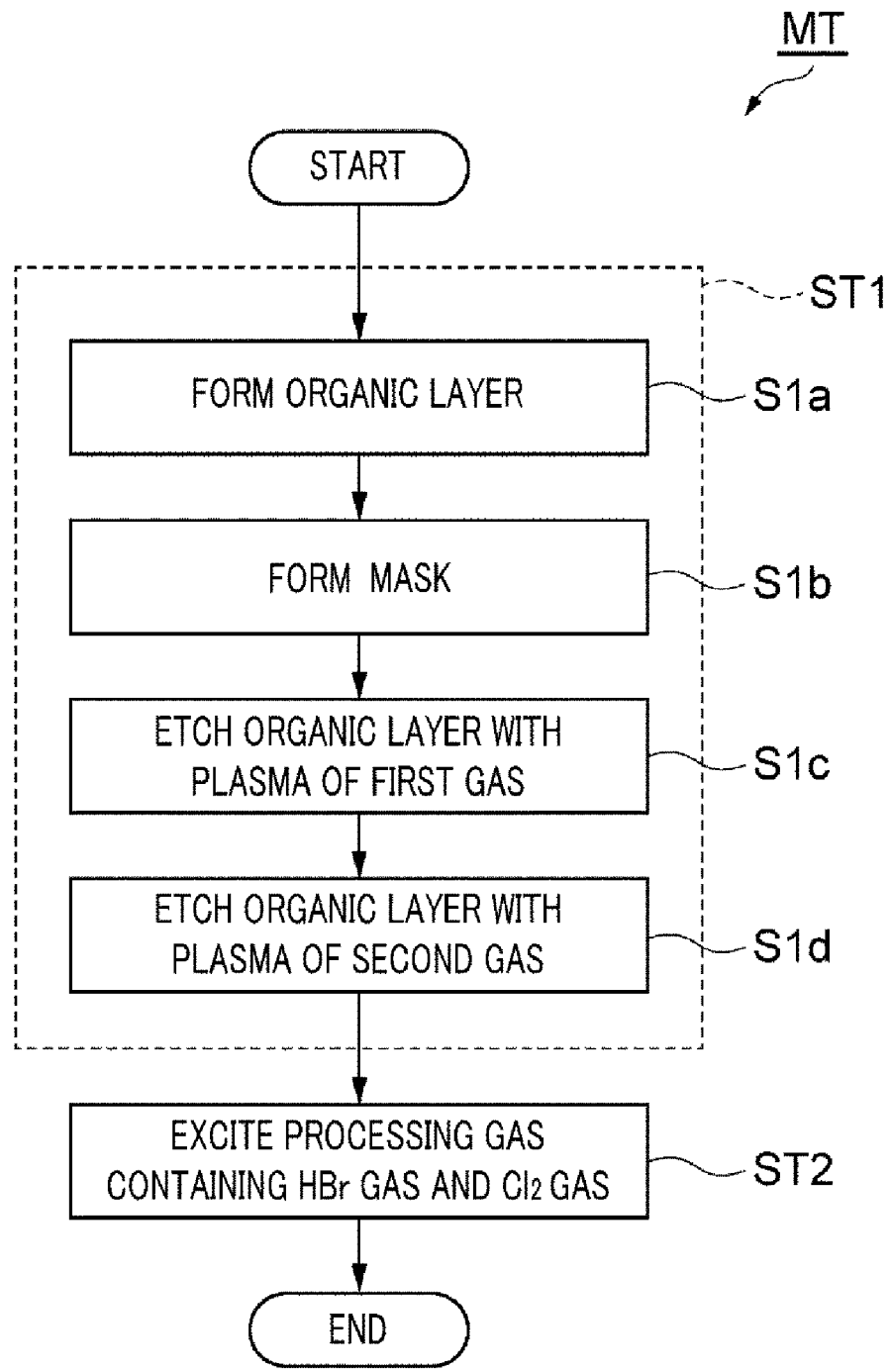
FIG. 1 is a flowchart showing a semiconductor device manufacturing method in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart showing a semiconductor device manufacturing method in accordance with an example embodiment. A method MT illustrated in FIG. 1 includes a process ST2. In this process ST2, a processing gas containing a HBr gas and a $Cl_2$ gas is excited within a processing chamber in order to etch a polycrystalline silicon layer of a target object within the processing chamber. In the example embodiment, the method MT may further include a process ST1. In this process ST1, an organic mask to be used for the etching in the process ST2 is formed.

The target object as an object to be processed by the method MT includes a substrate, regions made of silicon, a metal layer, and a polycrystalline silicon layer. The regions made of silicon are protruded from the substrate, and are arranged to form a gap. The metal layer is formed to cover the regions made of silicon. Further, the polycrystalline silicon layer is formed on the metal layer.

Figure 2:
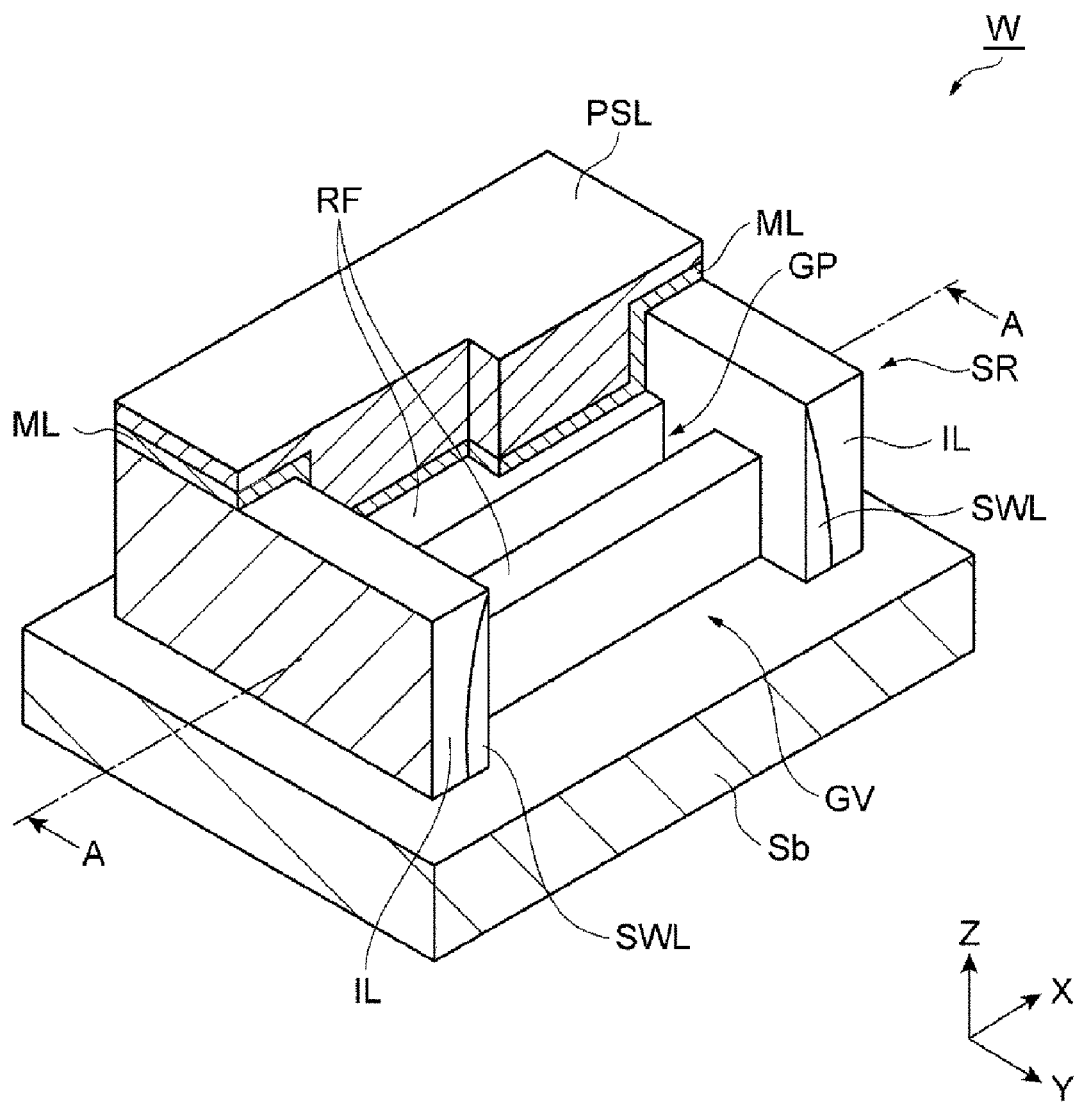
FIG. 2 is a partially broken perspective view illustrating an example of a target object.

A fin-type field effect transistor is an example of the semiconductor device manufactured by performing the method MT on the target object configured as described above. FIG. 2 is a partially broken perspective view illustrating an example of a target object as an object to be processed by the method MT and illustrates a target object (hereinafter, referred to as "wafer") W in the course of manufacturing a fin-type field effect transistor. In the wafer W depicted in FIG. 2, a region RF made of silicon includes multiple fin regions. Each of the multiple fin regions has a substantially hexahedral shape and is protruded from one main surface of a substrate Sb. These fin regions have a pair of side surfaces extended in a lengthwise direction thereof, i.e., an X-direction, parallel to the one main surface of the substrate Sb. The multiple fin regions are arranged in the direction parallel to the one main surface of the substrate Sb and in a direction (Y-direction) orthogonal to or intersecting with the X-direction. Therefore, there is formed a gap GP between two adjacent fin regions.

The wafer W further includes a pair of sidewall spacer layers SWL. The pair of sidewall spacer layers SWL is made of, for example, SiN and is protruded from the one main surface of the substrate Sb. The pair of sidewall spacer layers SWL is formed to face each other in the X-direction, so that a groove GV is formed. The multiple fin regions are extended within the groove GV, i.e., between the sidewall spacer layers SWL. Further, an insulating layer IL made of, for example, $SiO_2$ is formed outside the pair of sidewall spacer layers SWL in the X-direction.

A metal layer ML is made of, for example, TiN. The metal layer ML is formed to cover the multiple fin regions, the one main surface of the substrate Sb between adjacent fin regions, and a top surface of the insulating layer IL. On the metal layer ML, a polycrystalline silicon layer PSL is formed. The polycrystalline silicon layer PSL is formed to be within the gap GP.

In the example embodiment, a structure SR including the sidewall spacer layers SWL, the insulating layer IL, the multiple fin regions, the metal layer ML, and the polycrystalline silicon layer PSL as illustrated in FIG. 2 is multiple in number on the substrate Sb. In this example embodiment, the wafer W may include a dense region where the structures SR are densely arranged and a sparse region where the structures SR are sparsely arranged. Hereinafter, the method MT will be explained in more detail with an example of the wafer W illustrated in FIG. 2.

FIG. 1 will be referred to again. In addition to FIG. 1, FIG. 3A to FIG. 6 will be referred to. FIG. 3A to FIG. 6 are diagrams for explaining each process and illustrate a cross section of the wafer W after each process or during each process. Further, each of the cross sections as shown in FIG. 3A to FIG. 6 corresponds to a cross section taken along a line indicated by an arrow A-A in FIG. 2. In the process ST1 of the method MT, an organic mask is formed on the wafer W illustrated in FIG. 2 and FIG. 3A. The process ST1 includes processes S1a, S1b, S1c, and S1d.

Figure 3A:
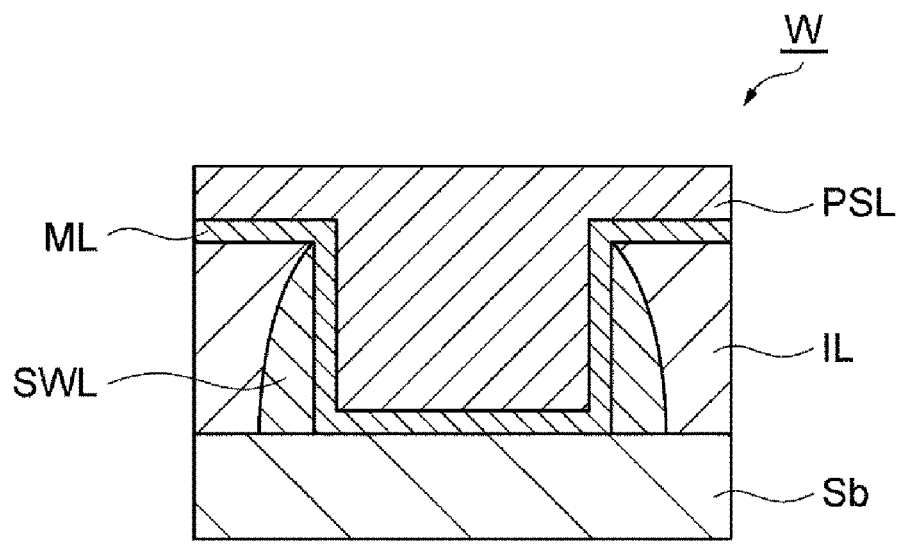
FIG. 3A and FIG. 3B are diagrams for explaining each process of a method MT.
Figure 3B:
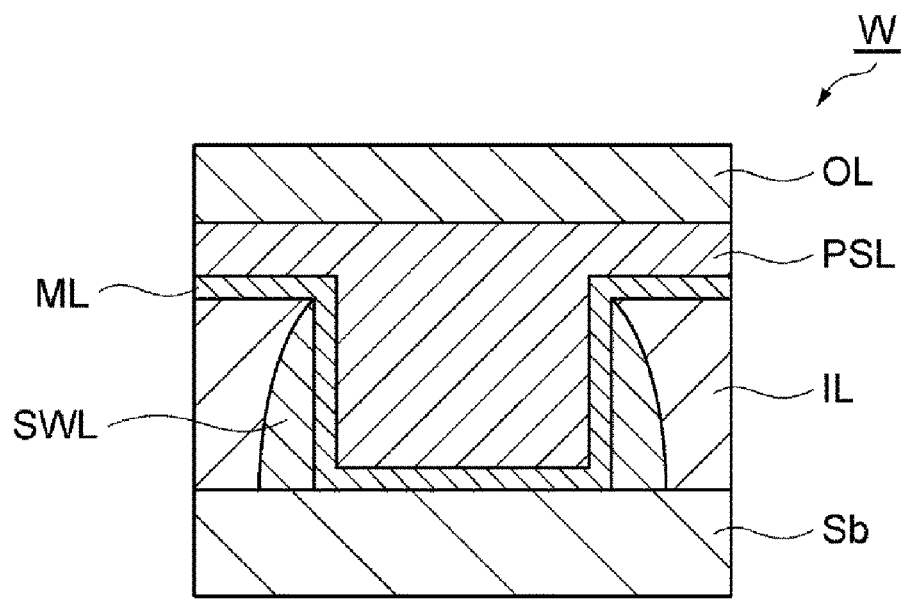

In the process S1a (form organic layer), as shown in FIG. 3B, an organic layer OL is formed on the polycrystalline silicon PSL of the wafer W. The organic layer OL may be formed of, for example, amorphous carbon. The organic layer OL may be formed by a certain film forming method such as CVD (Chemical Vapor Deposition).

Figure 4A:
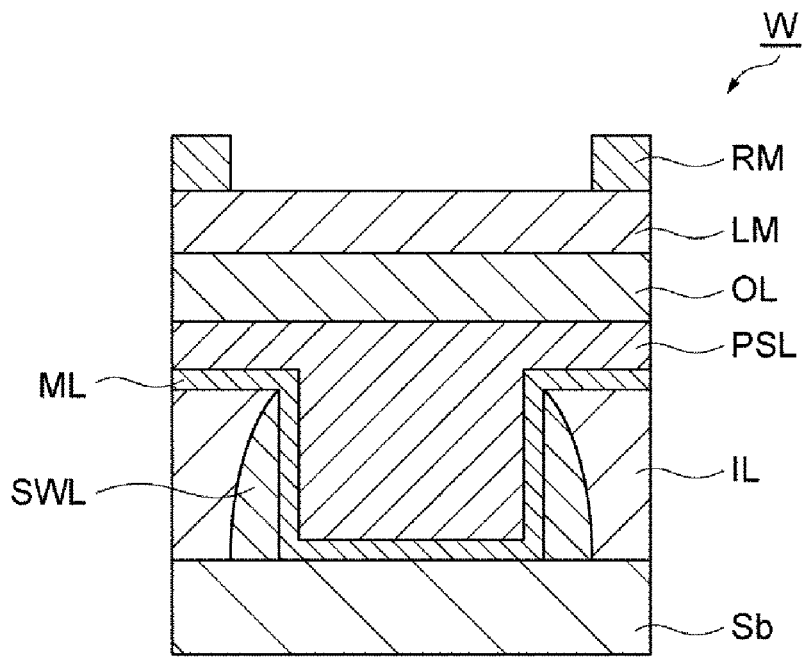
FIG. 4A and FIG. 4B are diagrams for explaining each process of the method MT.

Then, in the process S1b (form mask), a mask is formed. Therefore, as shown in FIG. 4A, a layer LM is formed on the organic layer OL, and a resist mask RM is formed on the layer LM. The layer LM is made of a material having a resistance against the etching of the organic layer OL and may be made of, for example, SiON. The layer LM may be formed by a certain film forming method such as CVD. Further, the resist mask RM is formed by the lithography and has a pattern corresponding to a pattern of a mask OMK. The mask OMK is formed from the organic layer OL and will be described later.

Figure 4B:
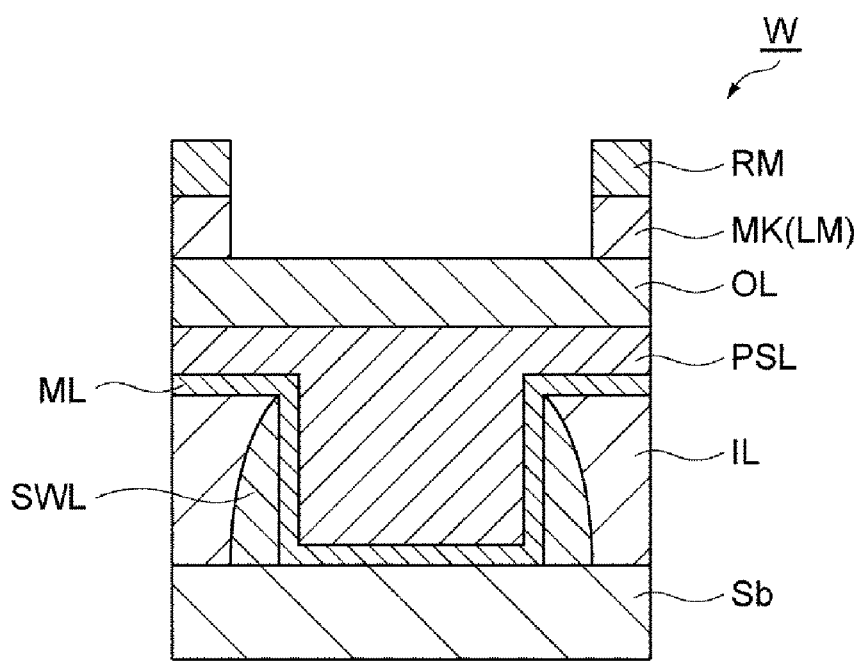
Figure 5A:
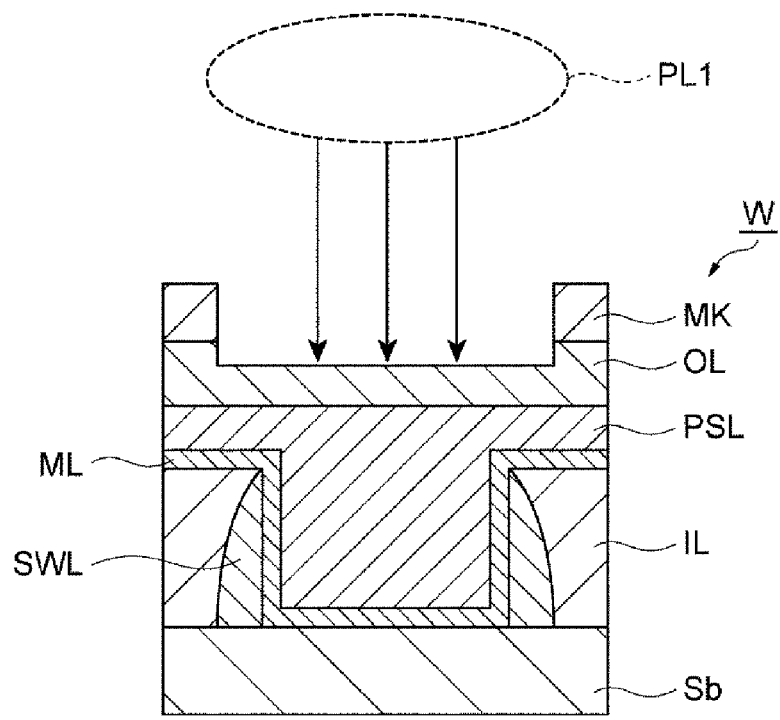
FIG. 5A and FIG. 5B are diagrams for explaining each process of the method MT.
Figure 5B:
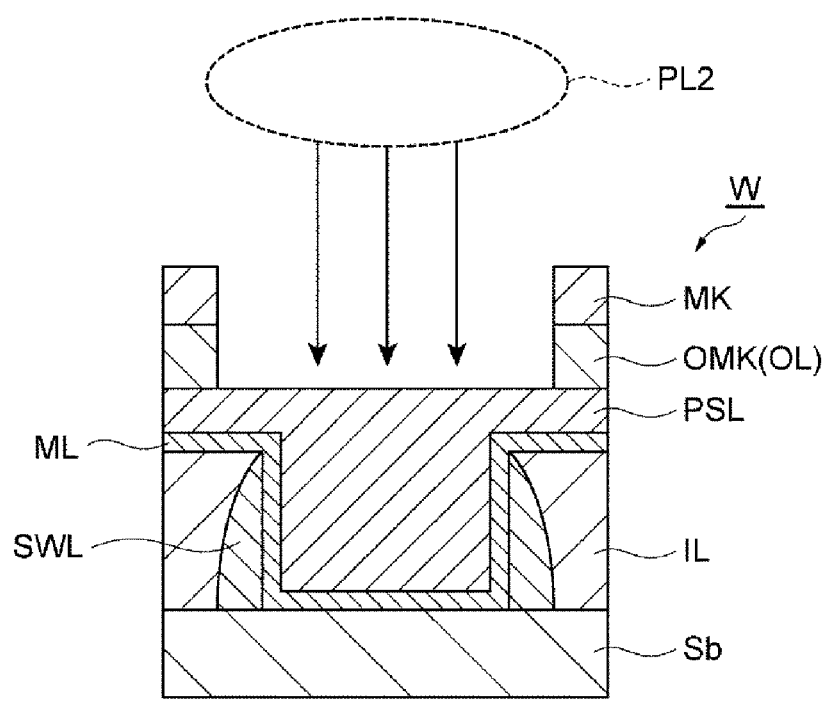
Figure 6:
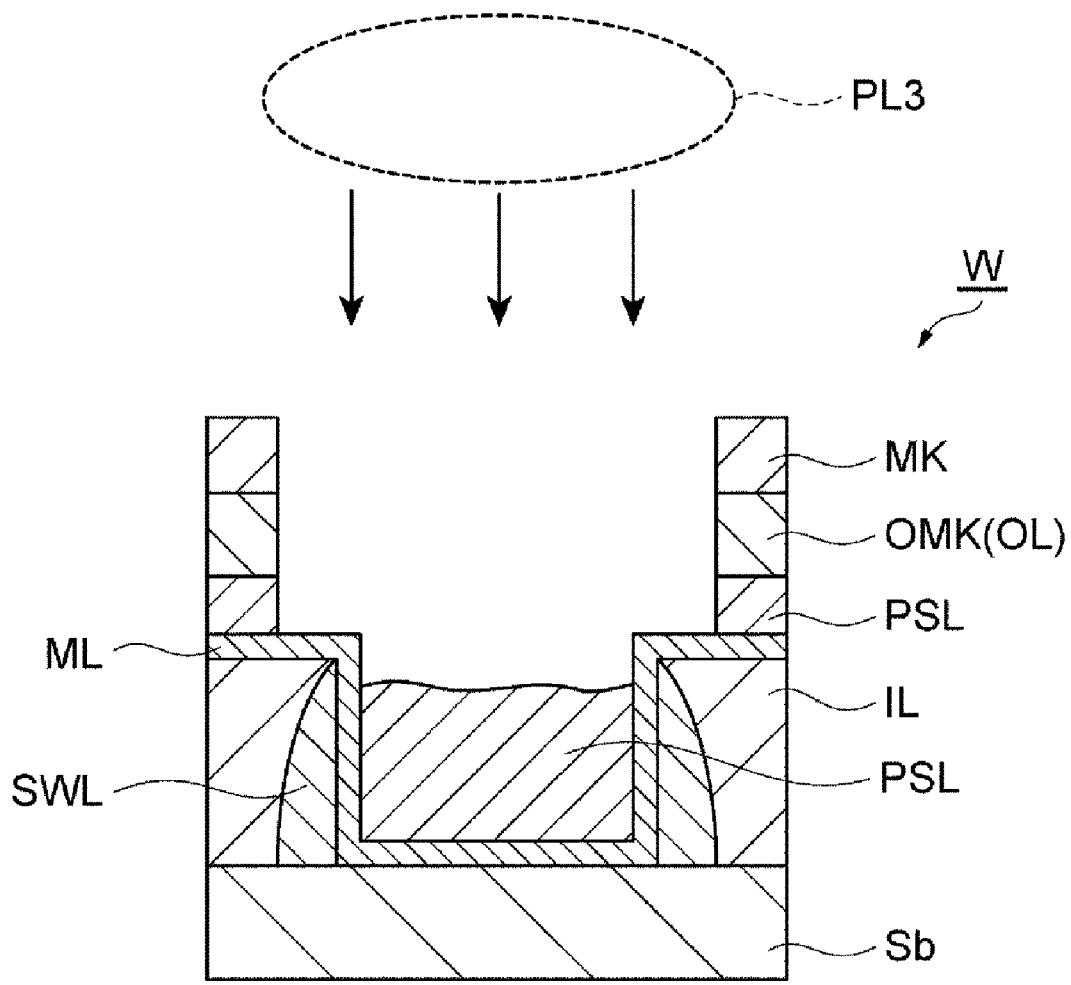
FIG. 6 is a diagram for explaining each process of the method MT.

Thereafter, in the process S1b, an etching process is carried out to transcribe the pattern of the resist mask RM onto the layer LM. The process S1b may be carried out by a certain plasma processing apparatus. By way of example, the process S1b may be carried out by a plasma processing apparatus using a microwave as a plasma source, or by an inductively coupled plasma processing apparatus. In the process S1b, an etching gas is supplied into a processing chamber of the plasma processing apparatus and the layer LM is etched with plasma generated by exciting the etching gas. As the etching gas for the layer LM, for example, a mixed gas including a $CF_4$ gas and a $CHF_3$ gas may be used. Through the process S1b, a mask MK is formed from the layer LM as illustrated in FIG. 4B.

Then, in the process S1c (etch organic layer with plasma of first gas), the organic layer OL is etched to transcribe a pattern of the mask MK. In the process S1c, the organic layer OL is etched to a certain portion of the film thickness thereof. The process S1c may be carried out by a certain plasma processing apparatus. By way of example, the process S1c may be carried out by a plasma processing apparatus using a microwave as a plasma source, or by an inductively coupled plasma processing apparatus. In the process S1c, a first gas is supplied into a processing chamber of the plasma processing apparatus and the organic layer OL is etched with plasma PL1 generated by exciting the first gas (see FIG. 5A). The first gas may contain an $O_2$ gas.

In the process S1c of the example embodiment, the first gas may further contain a HBr gas and a rare gas such as an Ar gas in addition to the $O_2$ gas. Further, in the process S1c of the example embodiment, a pressure within the processing chamber is set to be about 80 mTorr (about 10.67 Pa) or more. Since the pressure within the processing chamber is set to be about 80 mTorr while using the first gas containing the HBr gas, it is possible to suppress re-dissociation of a reaction product. As a result, if the wafer W includes the dense region and the sparse region, the organic layer OL can be etched in the both regions in the substantially same depth. That is, it is possible to reduce a difference in dimension between a pattern formed on the organic layer OL in the dense region and a pattern formed on the organic layer OL in the sparse region. Further, under such a high pressure, plasma can be efficiently generated by the plasma processing apparatus using a microwave as a plasma source as described below.

Then, in the process S1d (etch organic layer with plasma of second gas), the organic layer OL is further etched to transcribe the pattern of the mask MK. In the process S1d, the organic layer OL is further etched until the underlying polycrystalline silicon layer PSL is exposed, and the organic mask OMK (OL) is formed (see FIG. 5B). The process S1d may be carried out by a certain plasma processing apparatus. By way of example, the process S1d may be carried out by a plasma processing apparatus using a microwave as a plasma source, or by an inductively coupled plasma processing apparatus. In the process S1d, a second gas is supplied into a processing chamber of the plasma processing apparatus and the organic layer OL is etched with plasma PL2 generated by exciting the second gas (see FIG. 5B). The second gas may contain a $N_2$ gas and a $H_2$ gas.

As such, in the method MT, from the certain portion of the film thickness of the organic layer OL, the organic layer OL is etched with the plasma of the second gas containing the $N_2$ gas and the $H_2$ gas. Thus, it is possible to suppress the underlying polycrystalline silicon layer PSL from being oxidized. As a result, after the process S1d, a process of removing a silicon oxide film can be omitted and the process ST2 can be carried out. Further, since the organic layer OL is not entirely etched with the plasma of the second gas but etched from the certain portion of the film thickness thereof with the plasma of the second gas, a deposition amount of a reaction product between nitrogen of the second gas and carbon of the organic layer OL on a surface of the organic mask OMK can be reduced. Particularly, such deposition often may occur in the sparse region. However, since the process S1d is applied from the certain portion of the film thickness of the organic layer OL, the deposition amount of the reaction product can be reduced. Thus, it is possible to reduce a difference in dimension between a pattern of the organic mask OMK in the sparse region and a pattern of the organic mask OMK in the dense region.

In the process S1d of the example embodiment, the second gas may be excited by a plasma processing apparatus using a microwave as a plasma source as described below. Since the second gas is excited with a microwave, dissociation of hydrogen can be suppressed. Thus, even if a pressure within the processing chamber is set to be relatively low, for example, about 20 mTorr (about 2.666 Pa) or less, it is possible to suppress damage to the underlying layer of the organic layer OL. Further, since the pressure within the processing chamber is set to be high, for example, about 100 mT or more, ion energy can be further suppressed. Thus, it is possible to further suppress damage to the underlying layer.

Then, in the method MT, the process ST2 (excite processing gas containing HBr gas and $Cl_2$ gas) is carried out. In the process ST2, a processing gas containing a HBr gas and a $Cl_2$ gas is supplied into the processing chamber of the plasma processing apparatus, and plasma PL3 of the processing gas is generated. With the plasma PL3, a region exposed from an opening of the organic mask OMK, i.e., the polycrystalline silicon layer PSL exposed from the opening of the organic mask OMK, is etched (see FIG. 6).

The $Cl_2$ gas in the processing gas is supplied into the processing chamber at a flow rate of about 5% or more to about 10% or less with respect to a flow rate of the HBr gas. If the $Cl_2$ gas having the flow rate of about 5% or more with respect to the flow rate of the HBr gas is contained in the processing gas, it is possible to suppress the polycrystalline silicon layer PSL from being left. By way of example, it is possible to suppress a reaction product between the polycrystalline silicon layer PSL and an active species in the plasma from being left.

Figure 7:
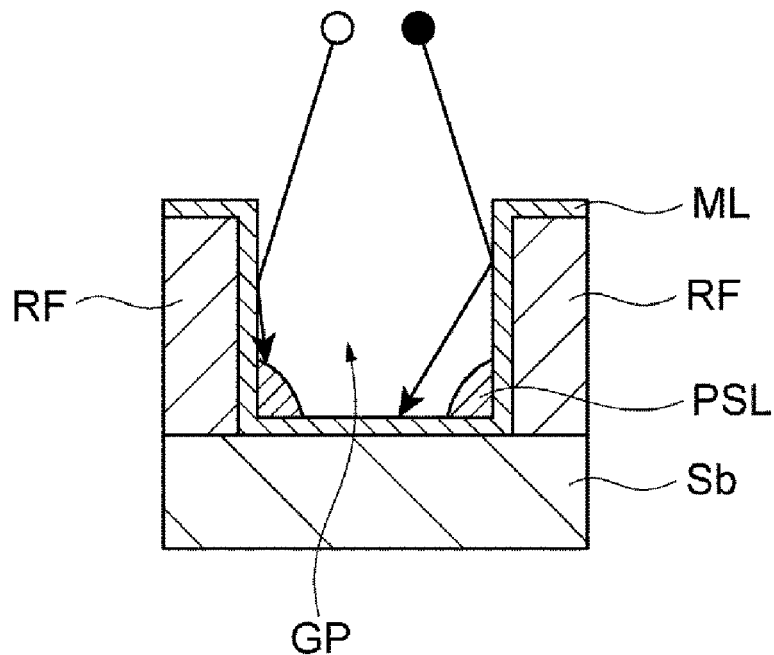
FIG. 7 is a diagram for explaining a principle of a process ST2.

Further, if the $Cl_2$ gas having the flow rate of about 5% or more with respect to the flow rate of the HBr gas is contained in the processing gas, it is also possible to suppress the polycrystalline silicon layer PSL from remaining in the gap GP. Here, FIG. 7 will be referred to. FIG. 7 is a diagram for explaining a principle of the process ST2. In FIG. 7, an active species of chlorine is indicated by a white circle, and an active species of bromine is indicated by a black circle. As shown in FIG. 7, if the active species of bromine is incident into a side surface of the gap GP, it is reflected in a direction having a large angle against the side surface thereof. Meanwhile, if the active species of chlorine is incident into a side surface of the gap GP, it is reflected at a smaller angle against the side surface thereof than the active species of bromine. As such, the active species of chlorine tends to reach an edge of a bottom portion of the gap GP. Therefore, since the processing gas contains the Cl$_2$ gas, it is possible to suppress the polycrystalline silicon layer PSL from being left.

Further, as described above, if the Cl$_2$ gas contained in the processing gas has the flow rate of about 10% or less with respect to the flow rate of the HBr gas, it is possible to suppress damage to the metal layer ML.

This process ST2 may be carried out by a certain plasma processing apparatus. By way of example, the process ST2 may be carried out by a plasma processing apparatus using a microwave as a plasma source, or by an inductively coupled plasma processing apparatus. In the process ST2, the pressure within the processing gas is set to be about 50 mTorr (about 6.666 Pa) or more. Since the pressure within the processing chamber is set to such a pressure, the polycrystalline silicon layer PSL can be etched with ions having low energy. Thus, it is possible to suppress damage to the metal layer ML. Further, under such a high pressure, plasma can be efficiently generated by the plasma processing apparatus using a microwave as a plasma source as described below.

In the process ST2 of the example embodiment, the processing gas may further contain a rare gas such as an Ar gas. This rare gas may also be a He gas. The He gas has a smaller atomic weight than the Ar gas. Thus, with the He gas as a rare gas, it is possible to further suppress damage to the metal layer ML.

Figure 8:
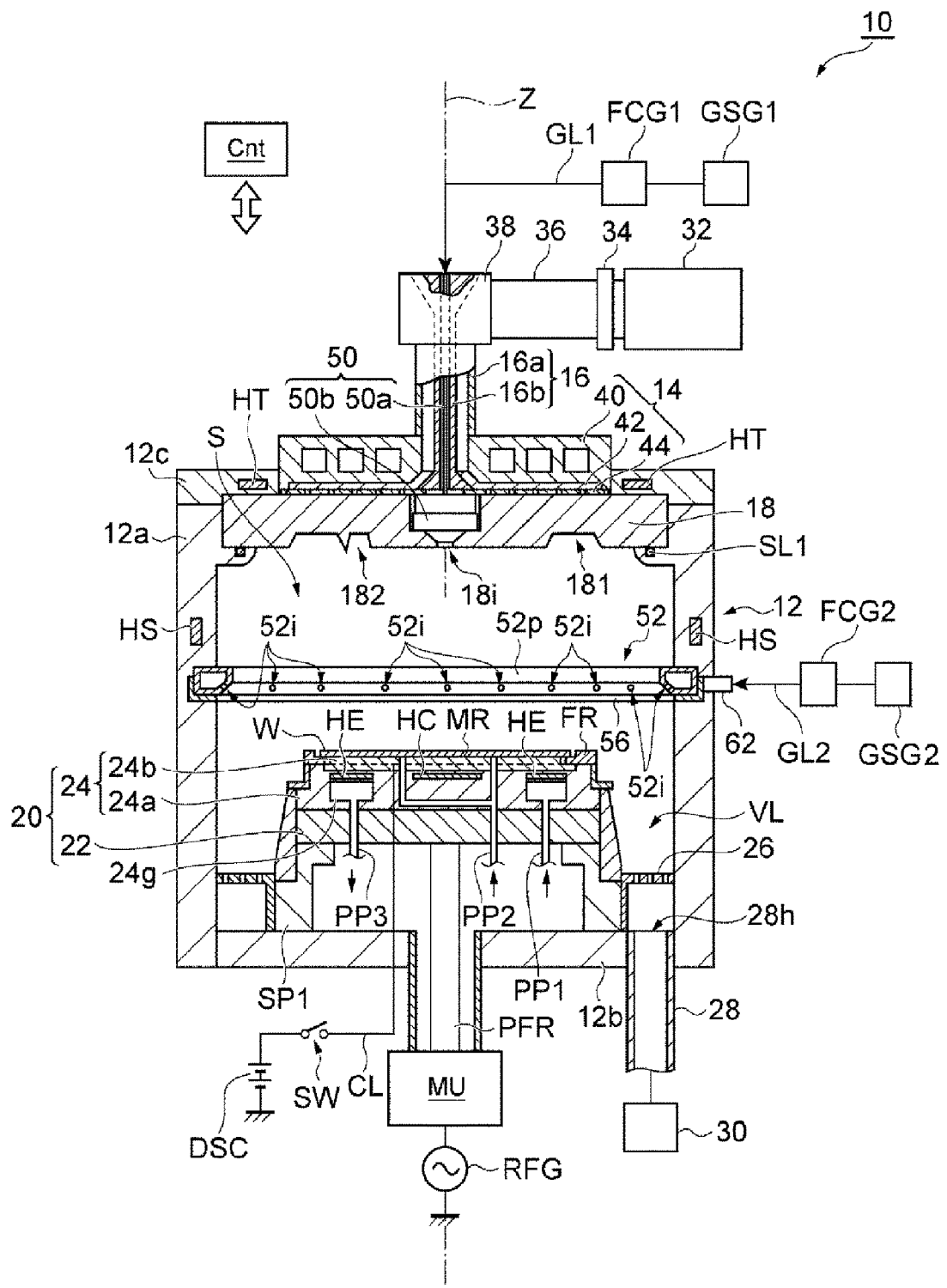
FIG. 8 is a schematic cross-sectional view of a plasma processing apparatus in accordance with an example embodiment.

Hereinafter, there will be explained an example of a plasma processing apparatus capable of performing the processes S1b, S1c, S1d, and ST2 of the method MT. FIG. 8 is a schematic cross-sectional view of a plasma processing apparatus in accordance with the example embodiment. A plasma processing apparatus 10 illustrated in FIG. 8 uses a microwave as a plasma source. The plasma processing apparatus 10 can be used in at least one of the processes S1b, S1c, S1d, and ST2.

The plasma processing apparatus 10 includes a processing chamber 12. In the processing chamber 12, a processing space S for accommodating the wafer W is formed. The processing chamber 12 may include a sidewall 12a, a bottom portion 12b, and a ceiling portion 12c.

The sidewall 12a has a substantially cylindrical shape extending in a direction, in which an axis line Z extends (hereinafter, referred to as "axis line Z direction"), approximately around the axis line Z. An inner diameter of the sidewall 12a is, for example, about 540 mm. The bottom portion 12b is provided at a lower end side of the sidewall 12a. An upper end of the sidewall 12a has an opening. The opening of the upper end of the sidewall 12a is closed by a dielectric window 18. The dielectric window 18 is held between the upper end of the sidewall 12a and the ceiling portion 12c. Between the dielectric window 18 and the upper end of the sidewall 12a, a sealing member SL1 may be interposed. The sealing member SL1 is, for example, an O-ring and configured to seal the processing chamber 12.

The plasma processing apparatus 10 further includes a mounting table 20. The mounting table 20 is provided under the dielectric window 18 within the processing chamber 12. The mounting table 20 includes a plate 22 and an electrostatic chuck 24.

The plate 22 is a metallic member having a substantial disc shape and formed of, for example, aluminum. The plate 22 is supported by a cylindrical supporting member SP1. The supporting member SP1 extends vertically upwards from the bottom portion 12b. The plate 22 serves as a high frequency electrode. The plate 22 is electrically connected to a high frequency power supply RFG, which generates a high frequency bias power, via a matching unit MU and a power supply rod PFR. The high frequency power supply RFG outputs high frequency bias power having a certain frequency of about, for example, about 13.65 MHz suitable for controlling energy of ions attracted to the wafer W. The matching unit MU accommodates a matching unit configured to match impedance on the side of the high frequency power supply RFG with load impedance such as mainly an electrode, plasma, and the processing chamber 12. Within the matching device, a blocking capacitor for generating self-bias is included.

At an upper surface of the plate 22, the electrostatic chuck 24 is provided. The electrostatic chuck 24 includes a base plate 24a and a chuck portion 24b. The base plate 24a is a metallic member having a substantial disc shape and formed of, for example, aluminum. The base plate 24a is provided on the plate 22. At an upper surface of the base plate 24a, the chuck portion 24b is provided. An upper surface of the chuck portion 24b serves as a mounting region MR on which the wafer W is mounted. The chuck portion 24b is configured to hold the wafer W with an electrostatic adsorptive force. The chuck portion 24b includes an electrode film interposed between dielectric films. The electrode film of the chuck portion 24b is electrically connected to a DC power supply DSC via a switch SW and a coated line CL. The chuck portion 24b attracts and holds the wafer W on an upper surface thereof with a Coulomb force generated by a DC voltage applied from the DC power supply DSC. A focus ring FR is provided diametrically outside the chuck portion 24b to surround an edge of the wafer W.

Further, the plasma processing apparatus 10 includes a temperature control unit. As a part of the temperature control unit, an annular coolant path 24g extending along the circumferential direction of the base plate 24a is provided within the base plate 24a. A coolant, for example, cooling water, having a certain temperature is supplied from a chiller unit through pipes PP1 and PP3 to be circulated through the coolant path 24g. A process temperature of the wafer W on the chuck portion 24b can be controlled by a temperature of the coolant. Further, a heat transfer gas, for example, a He gas, is supplied between the upper surface of the chuck portion 24b and a rear surface of the wafer W from a heat transfer gas supply unit through a supply pipe PP2.

Further, the plasma processing apparatus 10 may further include heaters HT, HS, HC, and HE as a part of the temperature control unit. The heater HT is provided within the ceiling portion 12c and annularly extends to surround an antenna 14. Further, the heater HS is provided within the sidewall 12a and annularly extends. The heater HC is provided within the base plate 24a. The heater HC is provided under a central portion of the mounting region MR, i.e. at a region through which the axis line Z is passed, within the base plate 24a. Furthermore, the heater HE is provided within the base plate 24a and annularly extends to surround the heater HC. The heater HE is provided under an outer periphery portion of the mounting portion MR.

Around the mounting table 20, an annular exhaust path VL is formed. At a portion of the exhaust path VL in the axis line Z direction, an annular baffle plate 26 including multiple through holes is provided. The exhaust path VL is connected to an exhaust line 28 having an exhaust opening 28h. The exhaust line 28 is provided at the bottom portion 12b of the processing chamber 12. The exhaust line 28 is connected to an exhaust device 30. The exhaust device 30 includes a pressure controller and a vacuum pump such as a turbo molecular pump. The processing space S within the processing chamber 12 can be depressurized to a desired vacuum level by the exhaust device 30. Further, a gas can be exhausted from an outer periphery of the mounting table 20 through the exhaust path VL by operating the exhaust device 30.

Further, the plasma processing apparatus 10 further includes the antenna 14, a coaxial waveguide 16, the dielectric window 18, a microwave generator 32, a tuner 34, a waveguide 36, and a mode converter 38. The microwave generator 32 is configured to generate a microwave having a frequency of, for example, about 2.45 GHz. The microwave generator 32 is connected to an upper portion of the coaxial waveguide 16 via the tuner 34, the waveguide 36 and the mode converter 38. A central axis line of the coaxial waveguide 16 is the axis line Z and extends along the axis line Z. In the example embodiment, a center of the mounting region MR of the mounting table 20 is positioned on the axis line Z.

The coaxial waveguide 16 includes an external conductor 16a and an internal conductor 16b. The external conductor 16a has a cylinder shape extending along the axis line Z as a central axis line thereof. A lower end of the external conductor 16a may be electrically connected to an upper portion of a cooling jacket 40 including a conductive surface. The internal conductor 16b is provided inside the external conductor 16a to be coaxial with the external conductor 16a. The internal conductor 16b has a cylindrical shape extending along the axis line Z as a central axis line thereof. A lower end of the internal conductor 16b is connected to a slot plate 44 of the antenna 14.

In the example embodiment, the antenna 14 is a radial line slot antenna. The antenna 14 is positioned within the opening formed at the ceiling portion 12c and is also provided on an upper surface of the dielectric window 18. The antenna 14 includes a dielectric plate 42 and the slot plate 44. The dielectric plate 42 is configured to shorten a wavelength of a microwave and has a substantial disc shape. The dielectric plate 42 is formed of, for example, quartz or alumina. The dielectric plate 42 is held between the slot plate 44 and a lower surface of the cooling jacket 40. Therefore, the antenna 14 may include the dielectric plate 42, the slot plate 44, and the cooling jacket 40.

Figure 9:
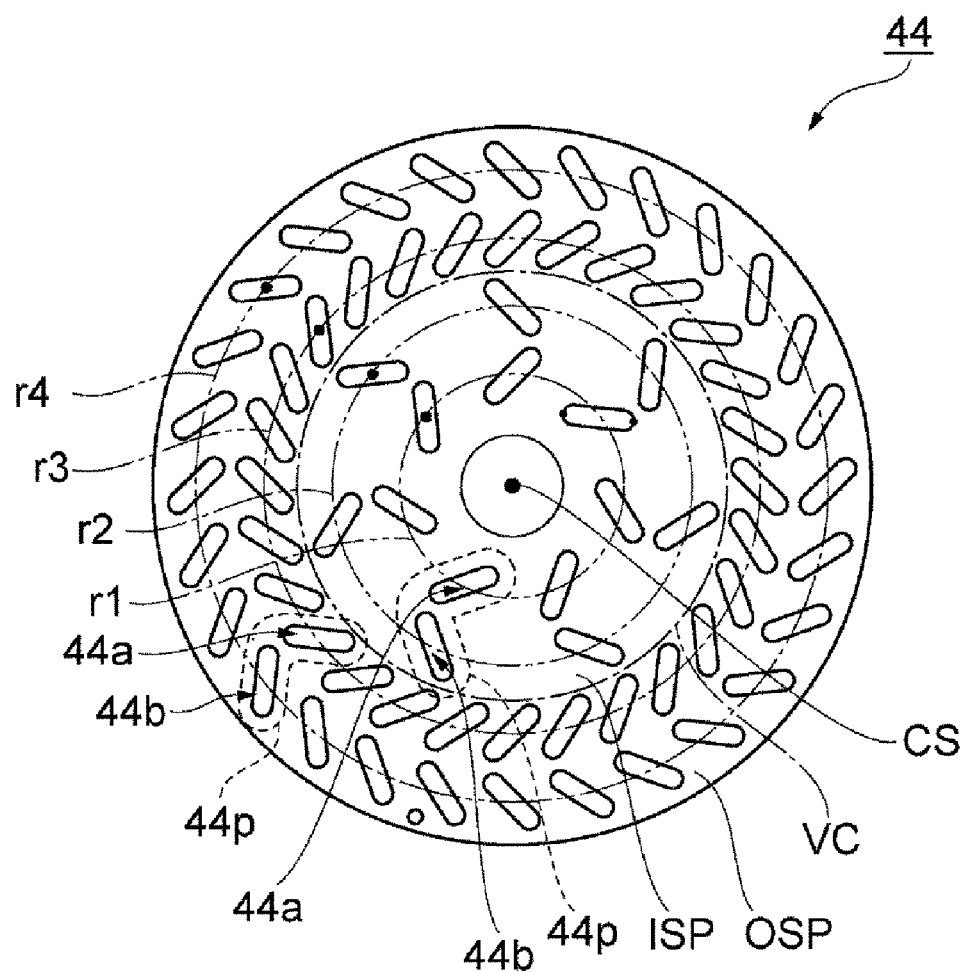
FIG. 9 is a plane view illustrating an example of a slot plate.

FIG. 9 is a plane view illustrating an example of a slot plate. The slot plate 44 has a thin plate shape and disc shape. Both surfaces of the slot plate 44 in a plate thickness direction are flat. A center CS of the circular slot plate 44 is positioned on the axis line Z. The slot plate 44 includes multiple slot pairs 44p. Each of the slot pairs 44p includes two slot holes 44a and 44b penetrating through the slot plate 44 in the thickness direction thereof. Each of the slot holes 44a and 44b has an elongated hole shape when viewed from the plane. In each of the slot pairs 44p, a direction in which a major axis of the slot hole 44a extends and a direction in which a major axis of the slot hole 44b extends are intersected with each other or orthogonal to each other.

In the example embodiment as illustrated in FIG. 9, the multiple slot pairs 44p are divided into an inner slot pair group ISP arranged inside a virtual circle VC around the axis line Z and an outer slot pair group OSP arranged outside the virtual circle VC. The inner slot pair group ISP includes multiple slot pairs 44p. In the example embodiment as illustrated in FIG. 9, the inner slot pair group ISP includes seven slot pairs 44p. The multiple slot pairs 44p belonging to the inner slot pair group ISP are equally spaced in a circumferential direction with respect to the center CS. Further, multiple slot holes 44a belonging to the inner slot pair group ISP are equally spaced such that the centers of the slot holes 44a are positioned on a circle having a radius r1 from the center CS of the slot plate 44. Further, multiple slot holes 44b belonging to the inner slot pair group ISP are equally spaced such that centers of the slot holes 44b are positioned on a circle having a radius r2 from the center CS of the slot plate 44. Herein, the radius r2 is greater than the radius r1.

The outer slot pair group OSP includes multiple slot pairs 44p. In the example embodiment as illustrated in FIG. 9, the outer slot pair group OSP includes twenty eight slot pairs 44p. The multiple slot pairs 44p belonging to the outer slot pair group OSP are equally spaced in the circumferential direction with respect to the center CS. Further, multiple slot holes 44a belonging to the outer slot pair group OSP are equally spaced such that the centers of the slot holes 44a are positioned on a circle having a radius r3 from the center CS of the slot plate 44. Further, multiple slot holes 44b belonging to the outer slot pair group OSP are equally spaced such that the centers of the slot holes 44b are positioned on a circle having a radius r4 from the center CS of the slot plate 44. Herein, the radius r3 is greater than the radius r2, and the radius r4 is greater than a radius r3.

Further, each slot hole 44a belonging to the inner slot pair group ISP and the outer slot pair group OSP is arranged such that a long side thereof has the same angle with respect to a line segment connecting the center CS and a center of each slot hole 44a. Furthermore, each slot hole 44b belonging to the inner slot pair group ISP and the outer slot pair group OSP is arranged such that the long side thereof has the same angle with respect to a line segment connecting the center CS and a center of each slot hole 44b.

Figure 10:
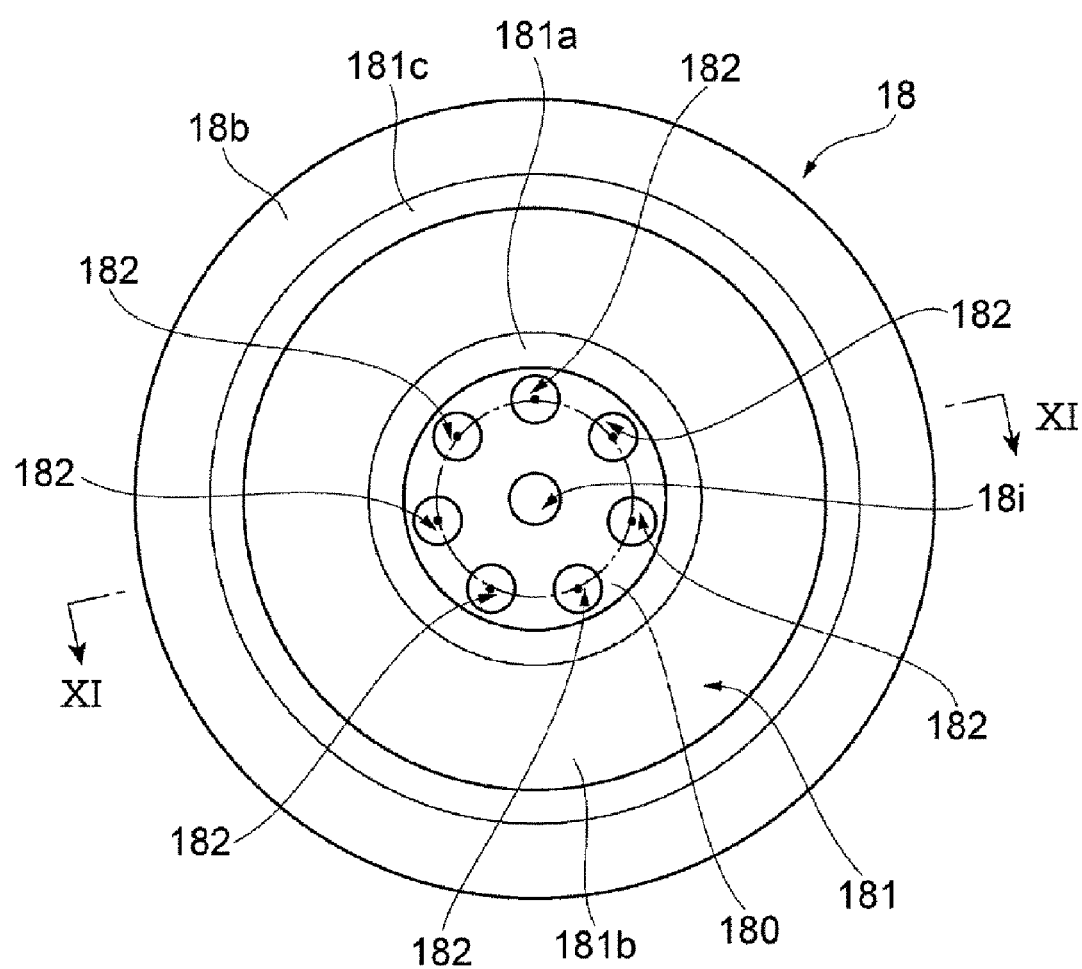
FIG. 10 is a plane view illustrating an example of a dielectric window.
Figure 11:
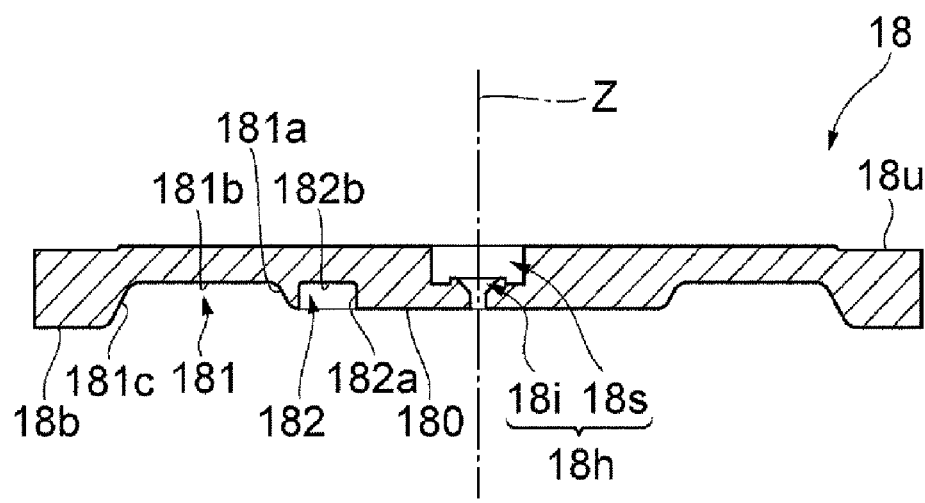
FIG. 11 is a cross-sectional view taken along a line XI-XI of FIG. 10.

FIG. 10 is a plane view illustrating an example of a dielectric window, and illustrates a status of the dielectric window when viewed from the processing space S. FIG. 11 is a cross-sectional view taken along a line XI-XI of FIG. 10. The dielectric window 18 has a substantial disc shape and is formed of a dielectric material such as quartz or alumina. On an upper surface 18u of the dielectric window 18, the slot plate 44 is provided.

A through hole 18h is formed at a central portion of the dielectric window 18. An upper portion of the through hole 18h serves as a space 18s for accommodating an injector 50b of a central inlet unit 50 to be described later, and a lower portion thereof serves as a central inlet opening 18i of the central inlet unit 50 to be described later. Further, a central axis line of the dielectric window 18 is identical with the axis line Z.

An opposite surface to the upper surface 18u of the dielectric window 18, i.e., a lower surface 18b of the dielectric window 18 is in contact with the processing space S and plasma is generated at the side of the lower surface 18b. In the lower surface 18b, various shapes are formed. To be specific, the lower surface 18b includes a planar surface 180 at a central portion surrounding the central inlet opening 18i. The planar surface 180 is a flat surface orthogonal to the axis line Z. In the lower surface 18b, a first recess portion 181 is annularly and continuously formed such that a sidewall thereof tapers upwardly in the thickness direction of the dielectric window 18.

The first recess portion 181 includes an inner tapered surface 181a, a bottom surface 181b, and an outer tapered surface 181c. The bottom surface 181b is formed at the side of the upper surface 18u rather than at the planar surface 180, and annularly extends in parallel with the planar surface 180. The inner tapered surface 181a annularly extends between the planar surface 180 and the bottom surface 181b, and is inclined with respect to the planar surface 180. Further, a periphery of the lower surface 18*b* is a surface in contact with the sidewall 12*a*.

Further, in the lower surface 18*b*, multiple second recess portions 182 are formed to be upwardly recessed in the plate thickness direction from the planar surface 180. The number of the multiple second recess portions 182 is seven in the example embodiment as illustrated in FIG. 10 and FIG. 11. These multiple second recess portions 182 are equally spaced along the circumferential direction thereof. Further, each of the multiple second recess portions 182 has a circular shape when viewed from the plane on a surface orthogonal to the axis line Z. To be specific, an inner surface 182*a* of the second recess portion 182 is a cylindrical surface extending in the axis line Z direction. Further, a bottom surface 182*b* of the second recess portion 182 is formed at the side of the upper surface 18*u* rather than at the planar surface 180, and is a circular surface parallel with the planar surface 180.

Figure 12:
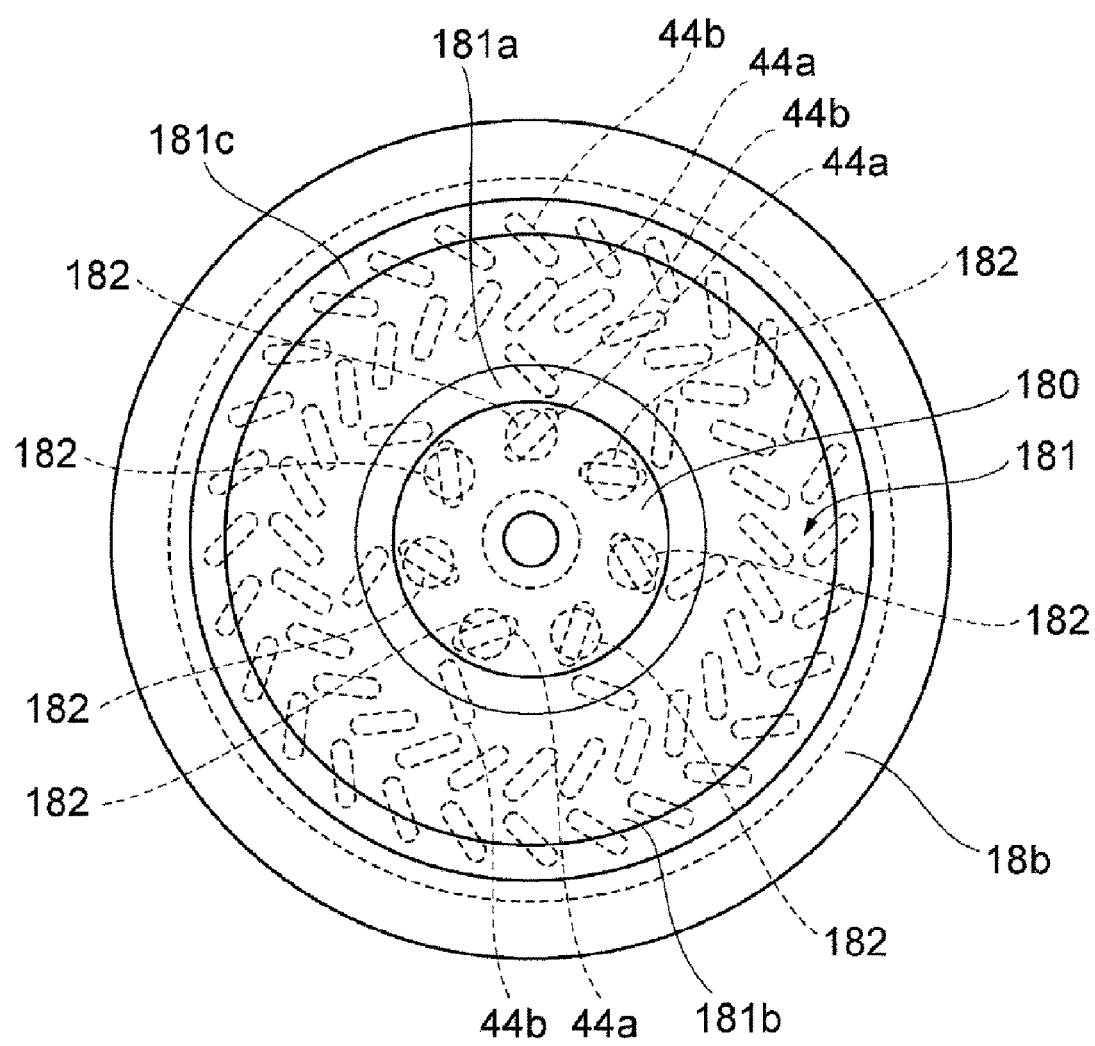
FIG. 12 is a plane view illustrating a status where the slot plate illustrated in FIG. 9 is provided on the dielectric window illustrated in FIG. 10.

FIG. 12 is a plane view illustrating a status where the slot plate illustrated in FIG. 9 is provided on the dielectric window illustrated in FIG. 10, and illustrates a status of the dielectric window 18 when viewed from the bottom. As illustrated in FIG. 12, when viewed from the plane, i.e., when viewed from the axis line Z direction, the multiple slot holes 44*a* and the multiple slot holes 44*b* belonging to the outer slot pair group OSP, and the multiple slot holes 44*b* belonging to the inner slot pair group ISP are overlapped with the first recess portion 181. To be specific, when viewed from the plane, a part of each slot hole 44*b* belonging to the outer slot pair group OSP is overlapped with the outer tapered surface 181*c*, and the other part thereof is overlapped with the bottom surface 181*b*. Furthermore, when viewed from the plane, the multiple slot holes 44*a* belonging to the outer slot pair group OSP are overlapped with the bottom surface 181*b*. Moreover, when viewed from the plane, a part of each slot hole 44*b* belonging to the inner slot pair group ISP is overlapped with the inner tapered surface 181*a*, and the other part thereof is overlapped with the bottom surface 181*b*.

Further, when viewed from the plane, i.e., when viewed from the axis line Z direction, each of the multiple slot holes 44*a* belonging to the inner slot pair group ISP is overlapped with each of the second recess portion 182. To be specific, when viewed from the plane, the center of the bottom surface of each second recess portion 182 is positioned within each slot hole 44*a* belonging to the inner slot pair group ISP.

Referring to FIG. 8 again, in the plasma processing apparatus 10, a microwave generated by the microwave generator 32 is propagated to the dielectric plate 42 through the coaxial waveguide 16, and is applied to the dielectric window 18 from the slot holes 44*a* and 44*b* of the slot plate 44.

In the dielectric window 18, as described above, a plate thickness of a portion where the first recess portion 181 is formed and a plate thickness of a portion where the second recess portion 182 is formed are smaller than a plate thickness of the other portions. Therefore, in the dielectric window 18, a microwave transmittance becomes higher at the portions where the first recess portion 181 and the second recess portion 182 are formed. Further, when viewed from the axis line Z direction, the slot holes 44*a* and 44*b* belonging to the outer slot pair group OSP and the slot holes 44*b* belonging to the inner slot pair group ISP are overlapped with the first recess portion 181, and each of the slot holes 44*a* belonging to the inner slot pair group ISP is overlapped with each of the second recess portion 182. Therefore, electric fields of the microwave are concentrated on the first recess portion 181 and the second recess portion 182, so that the microwave energy is concentrated on the first recess portion 181 and the second recess portion 182. As a result, it is possible to stably generate plasma at the first recess portion 181 and the second recess portion 182, and also possible to allow plasma right under the dielectric window 18 to be stably distributed in the diametrical direction and the circumferential direction.

Further, the plasma processing apparatus 10 further includes the central inlet unit 50 and a peripheral inlet unit 52. The central inlet unit 50 includes a pipe 50*a*, the injector 50*b*, and the central inlet opening 18*i*. The pipe 50*a* passes through an inner hole of the internal conductor 16*b* of the coaxial waveguide 16. Further, an end of the pipe 50*a* extends to the inside of the space 18*s* (see FIG. 11) of the dielectric window 18 along the axis line Z. Within the space 18*s* and under the end of the pipe 50*a*, the injector 50*b* is provided. The injector 50*b* includes multiple through holes extending in the axis line Z direction. Further, in the dielectric window 18, the central inlet opening 18*i* is formed. The central inlet opening 18*i* is continuously formed under the space 18*s* and extends along the axis line Z. The central inlet unit 50 described above is configured to supply a gas to the injector 50*b* through the pipe 50*a* and discharges the gas from the injector 50*b* through the central inlet opening 18*i*. As such, the central inlet unit 50 discharges the gas toward right under the dielectric window 18 along the axis line Z. That is, the central inlet unit 50 introduces the gas to a plasma generation region having a high electron temperature.

The peripheral inlet unit 52 includes multiple peripheral inlet openings 52*i*. The multiple peripheral inlet openings 52*i* mainly supply a gas toward an edge portion of the wafer W. The multiple peripheral inlet openings 52*i* are oriented to the edge portion of the wafer W or a periphery portion of the mounting region MR. The multiple peripheral inlet openings 52*i* are arranged along the circumferential direction between the central inlet opening 18*i* and the mounting table 20. That is, the multiple peripheral inlet openings 52*i* are annularly arranged around the axis line Z at a region (plasma diffusion region) having a lower electron temperature than right under the dielectric window. The peripheral inlet unit 52 supplies a gas toward the wafer W from a region having a low electron temperature. Therefore, it is possible to allow a dissociation degree of the gas introduced into the processing space S from the peripheral inlet unit 52 to be lower than a dissociation degree of the gas introduced into the processing space S from the central inlet unit 50.

Figure 13:
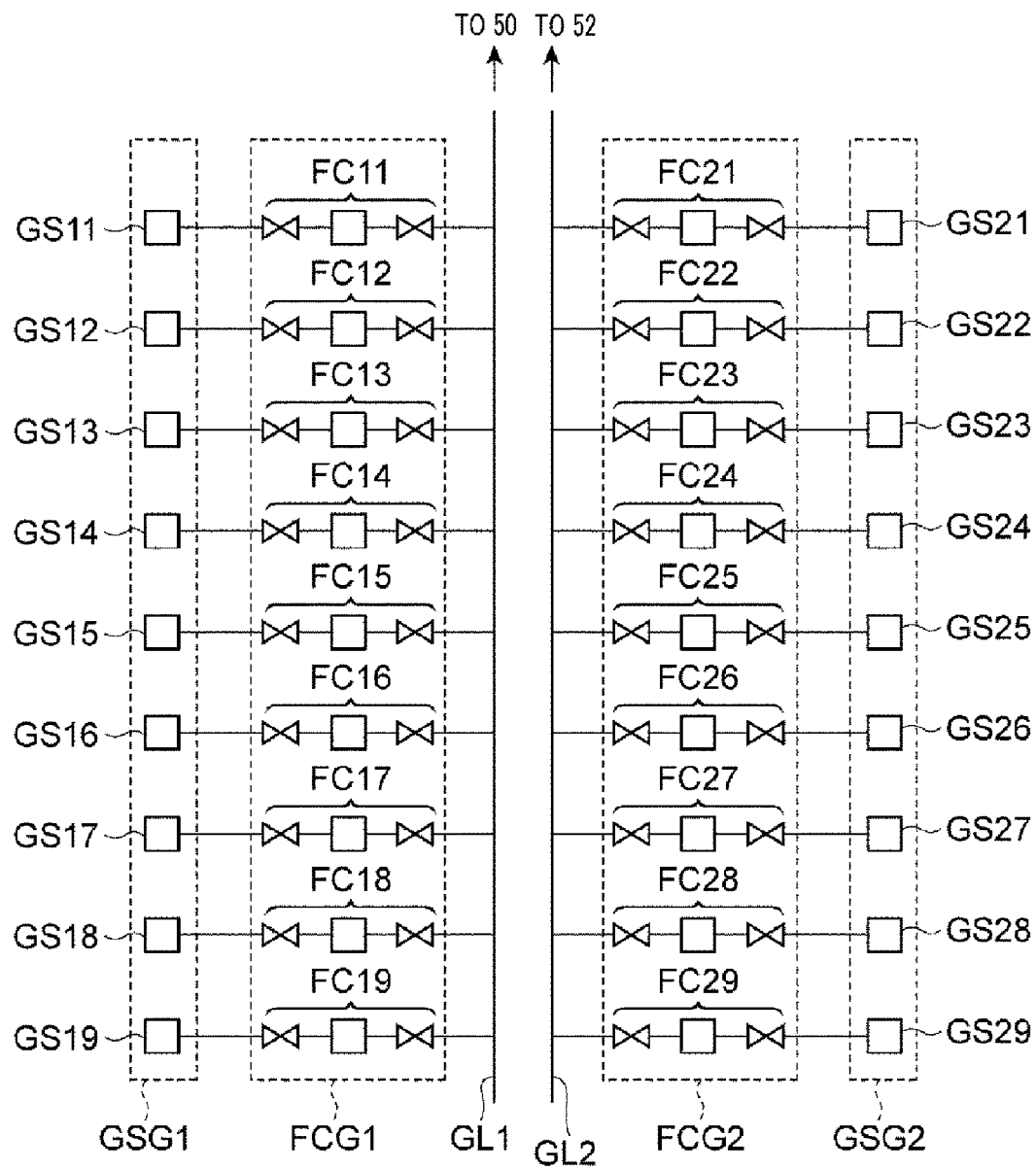
FIG. 13 illustrates a gas supply system including a first flow rate control unit group, a first gas source group, a second flow rate control unit group, and a second gas source group.

The central inlet unit 50 is connected to a first gas source group GSG1 via a first flow rate control unit group FCG1. Further, the peripheral inlet unit 52 is connected to a second gas source group GSG2 via a second flow rate control unit group FCG2. FIG. 13 illustrates a gas supply system including the first flow rate control unit group, the first gas source group, the second flow rate control unit group, and the second gas source group.

The first gas source group GSG1 includes multiple first gas sources GS11 to GS19. The first gas sources GS11, GS12, GS13, GS14, GS15, GS16, GS17, GS18, and GS19 are a $CF_4$ gas source, a $CHF_3$ gas source, an Ar gas source, a HBr gas source, an $O_2$ gas source, a $N_2$ gas source, a $H_2$ gas source, a He gas source, and a $Cl_2$ gas source, respectively.

The first flow rate control unit group FCG1 includes multiple first flow rate control units FC11 to FC19. Each of the multiple first flow rate control units FC11 to FC19 includes, for example, two valves and a flow rate controller provided between the two valves. The flow rate controller is, for example, a mass flow controller. The multiple first gas sources GS11 to GS19 are connected to a common gas line GL1 via the multiple first flow rate control units FC11 to FC19, respectively. The common gas supply line GL1 is connected to the central inlet unit 50.

The second gas source group GSG2 includes multiple second gas sources GS21 to GS29. The second gas sources GS21 to GS29 are sources of the same gases as those of the first gas sources GS11 to GS19.

The second flow rate control unit group FCG2 includes multiple second flow rate control units FC21 to FC29. Each of the multiple second flow rate control units FC21 to FC29 includes, for example, two valves and a flow rate controller provided between the two valves. The flow rate controller is, for example, a mass flow controller. The multiple second gas sources GS21 to GS29 are connected to a common gas line GL2 via the multiple second flow rate control units FC21 to FC29, respectively. The common gas supply line GL2 is connected to the peripheral inlet unit 52.

As such, in the plasma processing apparatus 10, the multiple first gas sources and the multiple first flow rate control units are provided only for the central inlet unit 50. Further, the multiple second gas sources and the multiple second flow rate control units, which are independent of these multiple first gas sources and multiple first flow rate control units, are provided only for the peripheral inlet unit 52. Therefore, it is possible to independently control a kind of a gas to be introduced into the processing space S from the central inlet unit 50 and a flow rate of one or more gases to be introduced into the processing space S from the central inlet unit 50, and also possible to independently control a kind of a gas to be introduced into the processing space S from the peripheral inlet unit 52 and a flow rate of one or more gases to be introduced into the processing space S from the peripheral inlet unit 52.

In the example embodiment, the peripheral inlet unit 52 may further include an annular line 52p. This line 52p includes multiple peripheral inlet openings 52i. The annular line 52p may be formed of, for example, quartz. As illustrated in FIG. 8, the annular line 52p is provided along an inner wall surface of the sidewall 12a in the example embodiment. In other words, the annular line 52p is not provided on a path connecting a lower surface of the dielectric window 18 with the mounting region MR, i.e., the wafer W. Therefore, the annular line 52p does not suppress diffusion of plasma. Further, since the annular line 52p is provided along the inner wall surface of the sidewall 12a, damage of the annular line 52p caused by plasma can be suppressed and a frequency of exchanging the annular line 52p can be reduced. Furthermore, since the annular line 52p is provided along the sidewall 12a of which temperature can be controlled by the heater, it is possible to improve stability of a temperature of a gas to be introduced into the processing space S from the peripheral inlet unit 52.

Further, in the example embodiment, the multiple peripheral inlet openings 52i are directed to the edge portion of the wafer W. That is, the multiple peripheral inlet openings 52i are inclined with respect to the flat surface orthogonal to the axis line Z to discharge a gas toward the edge portion of the wafer W. Since the peripheral inlet openings 52i are inclined and directed to the edge portion of the wafer W as such, active species of the gas discharged from the peripheral inlet openings 52i directly head toward the edge portion of the wafer W. Thus, the active species of the gas can be supplied to the edge portion of the wafer W without being deactivated. As a result, it is possible to reduce non-uniformity in a processing rate of each portion in a diametrical direction of the wafer W.

Furthermore, the plasma processing apparatus 10 further includes a control unit Cnt. The control unit Cnt may be a control device such as a programmable computer device. The control unit Cnt may control each component of the plasma processing apparatus 10 according to a program based on a recipe.

In the process S1b of the method MT as shown in FIG. 1, in order to etch the layer LM, the control unit Cnt controls the flow rate control units FC11, FC12, FC21, and FC22 to supply a mixed gas containing a $CF_4$ gas from the gas sources GS11 and GS21 and a $CHF_3$ gas from the gas sources GS12 and GS22 into the processing chamber 12; controls the exhaust device 30 to set a pressure within the processing chamber 12 to be a certain degree; controls the microwave generator 32 to supply a microwave having a certain power; and controls the high frequency power supply RFG to supply a certain high frequency bias power.

Further, in the process S1c, in order to etch the organic layer OL, the control unit Cnt controls the flow rate control units FC13, FC14, FC15, FC23, FC24, and FC25 to supply a mixed gas containing an Ar gas from the gas sources GS13 and GS23, a HBr gas from the gas sources GS14 and GS24, and an $O_2$ gas from the gas sources GS15 and GS25; controls the exhaust device 30 to set a pressure within the processing chamber 12 to be a certain degree, for example, about 80 mTorr (about 10.67 Pa) or more; controls the microwave generator 32 to supply a microwave having a certain power; and controls the high frequency power supply RFG to supply a certain high frequency bias power.

Further, in order to further etch the organic layer OL in the process S1d, the control unit Cnt controls the flow rate control units FC16, FC17, FC26, and FC27 to supply the second gas containing a $N_2$ gas from the gas sources GS16 and GS26 and a $H_2$ gas from the gas sources GS17 and GS27 into the processing chamber 12; controls the exhaust device 30 to set a pressure within the processing chamber 12 to be a certain degree, for example, about 20 mTorr (about 2.666 Pa) or about 100 mTorr (about 13.33 Pa); controls the microwave generator 32 to supply a microwave having a certain power; and controls the high frequency power supply RFG to supply a certain high frequency bias power.

Furthermore, in order to etch the polycrystalline silicon layer PSL in the process ST2, the control unit Cnt controls the flow rate control units FC14, FC15, FC18, FC19, FC24, FC25, FC28, and FC29 to supply the processing gas containing a He gas from the gas sources GS18 and GS28, a HBr gas from the gas sources GS14 and GS24, an $O_2$ gas from the gas sources GS15 and GS25, and a $Cl_2$ gas from the gas sources GS19 and GS29 into the processing chamber 12; controls the exhaust device 30 to set a pressure within the processing chamber 12 to be a certain degree, for example, about 50 mTorr (about 6.666 Pa) or more; controls the microwave generator 32 to supply a microwave having a certain power; and controls the high frequency power supply RFG to supply a certain high frequency bias power.

Hereinafter, there will be an experimental example carried out by using the plasma processing apparatus 10. In the experimental example, a process was performed on a wafer including a TiN film having a uniform thickness and a wafer including a polycrystalline silicon film having a uniform thickness with plasma of a processing gas containing a He gas, a HBr gas, an $O_2$ gas, and a $Cl_2$ gas. Further, in the experimental example, as a parameter, a flow rate of the $Cl_2$ gas with respect to a flow rate of the HBr gas was changed in various ways. Processing conditions in the experimental example were as follows.

Pressure within the processing chamber 12: 100 mTorr (13.33 Pa)

Microwave power: 2500 W

High frequency bias power: 150 W

Flow rate of He gas: 1000 sccm

Flow rate of HBr gas: 800 sccm

Flow rate of $O_2$ gas: 10 sccm

Flow rate of $Cl_2$ gas: four kinds of 0 sccm, 40 sccm, 80 sccm, and 120 sccm

Wafer temperature: 30° C.

Processing time: 90 seconds

Figure 14:
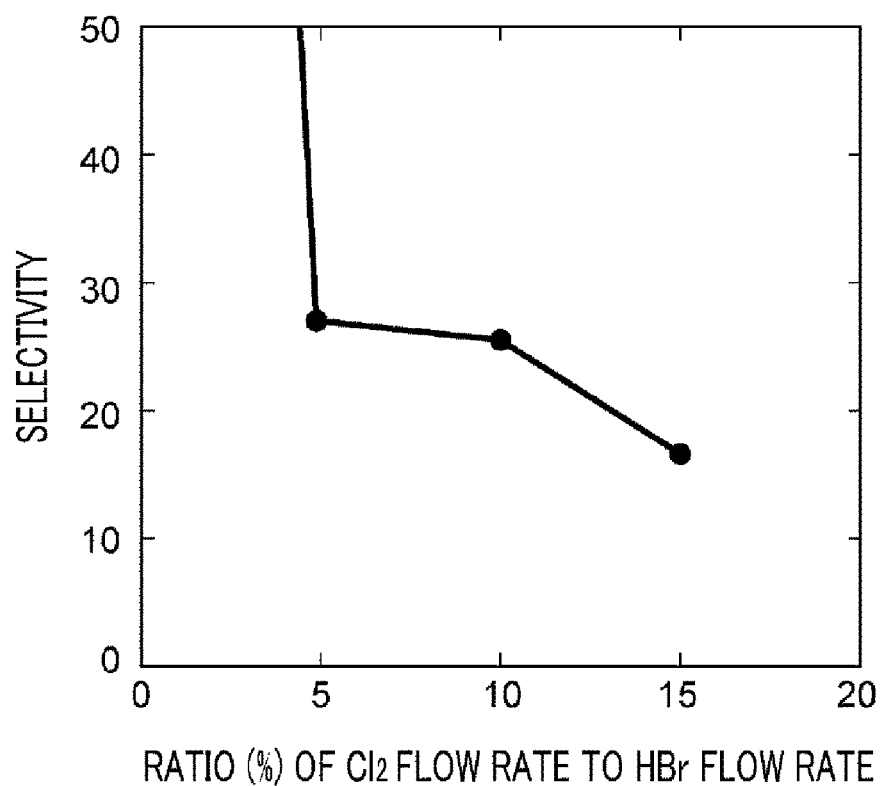
FIG. 14 shows a result of an experimental example.

In the experimental example, a ratio of a film thickness decrement of a polycrystalline silicon layer to a film thickness decrement of a TiN film processed with the processing gas containing a $Cl_2$ gas at the same flow rate ratio, i.e., etching selectivity of polycrystalline silicon to TiN was obtained. A result thereof is as shown in FIG. 14. As shown in FIG. 14, from the result of the experimental example, it was verified that if a $Cl_2$ gas having a flow rate of about 10% or more with respect to a flow rate of a HBr gas is contained in a processing gas, the etching selectivity is lowered, i.e., the metal layer is damaged. Further, it was verified that if a $Cl_2$ gas is contained in a processing gas at a flow rate of about 5% or more to about 10% or less, the etching selectivity is maintained. Furthermore, if a $Cl_2$ gas has a flow rate of about 5% or less with respect to a flow rate of a HBr gas in a processing gas, the etching selectivity is increased but it is difficult to suppress the polycrystalline silicon from being left. Therefore, it was verified that desirably, a $Cl_2$ gas is supplied at a flow rate of about 5% or more to about 10% or less with respect to a flow rate of a HBr gas in a processing gas in the process ST2.

The example embodiments are not limited to the above and can be modified and changed in various ways. By way of example, the apparatus used to perform the processes S1b, S1c, S1d, and ST2 for the etching in the method MT is not limited to a plasma processing apparatus using a microwave as a plasma source. By way of example, at least one of these processes S1b, S1c, S1d, and ST2 may be carried out by an inductively coupled plasma processing apparatus. Further, the metal layer ML is not limited to a TiN layer. The metal layer may be a layer containing Ti, or a layer containing Ta (tantalum). Further, the semiconductor device manufactured through the method MT is not limited to a fin-type field effect transistor. By way of example, the method MT can be performed to manufacture a field effect transistor having a gate stack structure.

From the foregoing, it will be appreciated that various embodiments of the present disclosure have been described herein for purposes of illustration, and that various modifications may be made without departing from the scope of the present disclosure. Accordingly, the various embodiments disclosed herein are not intended to be limiting, with the true scope being indicated by the following claims.

We claim:

1. A semiconductor device manufacturing method, comprising:
    exciting a processing gas containing a HBr gas and a $Cl_2$ gas within a processing chamber that accommodates a target object including a substrate, regions made of silicon, which are protruded from the substrate and arranged to form a gap, a metal layer formed to cover the regions, a polycrystalline silicon layer formed on the metal layer, and an organic mask formed on the polycrystalline silicon layer,
    wherein the $Cl_2$ gas is supplied at a flow rate of about 5% or more to about 10% or less with respect to a flow rate of the HBr gas in the processing gas.

2. The semiconductor device manufacturing method of claim 1,
    wherein in the exciting of the processing gas, a pressure within the processing chamber is set to be about 6.666 Pa or more and the processing gas is excited with a microwave.

3. The semiconductor device manufacturing method of claim 1,
    wherein the processing gas further contains a He gas.

4. The semiconductor device manufacturing method of claim 1,
    wherein the metal layer is a TiN layer.

5. The semiconductor device manufacturing method of claim 1,
    wherein in the target object, the regions made of silicon form fin regions of a fin-type field effect transistor.

6. The semiconductor device manufacturing method of claim 1, further comprising:
    forming the organic mask,
    wherein the forming of the organic mask includes:
    forming an organic layer on the polycrystalline silicon layer;
    forming a mask on the organic layer;
    etching the organic layer by generating plasma of a first gas containing an oxygen gas within the processing chamber; and
    etching the organic layer by generating plasma of a second gas containing a nitrogen gas and a hydrogen gas within the processing chamber.

7. The semiconductor device manufacturing method of claim 6,
    wherein in the etching of the organic layer by generating plasma of the first gas, the first gas further contains a HBr gas, a pressure within the processing chamber is set to be about 10.67 Pa or more, and the first gas is excited with a microwave.

* * * * *